United States Patent [19]

Hur et al.

[11] Patent Number: 5,449,924

[45] Date of Patent: Sep. 12, 1995

[54] PHOTODIODE HAVING A SCHOTTKY BARRIER FORMED ON THE LOWER METALLIC ELECTRODE

[75] Inventors: Chang W. Hur; Young H. Park; Kang H. Sung, all of Seoul, Rep. of Korea

[73] Assignee: Goldstar Electron Co., Ltd., Rep. of Korea

[21] Appl. No.: 186,796

[22] Filed: Jan. 25, 1994

[30] Foreign Application Priority Data

Jan. 28, 1993 [KR] Rep. of Korea ............... 1026/1993
Feb. 4, 1993 [KR] Rep. of Korea ............... 1491/1993
Mar. 26, 1993 [KR] Rep. of Korea ............... 4821/1993

[51] Int. Cl.$^6$ .................... H01L 27/14; H01L 31/00
[52] U.S. Cl. ........................ 257/54; 257/77; 257/449; 257/454; 257/456
[58] Field of Search ............ 257/54, 52, 53, 72, 257/77, 449, 453, 454, 456, 485

[56] References Cited

U.S. PATENT DOCUMENTS

| | | | |
|---|---|---|---|
| 4,811,069 | 3/1989 | Kakinuma et al. | 257/449 |
| 4,982,246 | 1/1991 | Polasko et al. | 257/54 |
| 4,999,693 | 3/1991 | Yamazaki et al. | 257/54 |

FOREIGN PATENT DOCUMENTS

| | | | |
|---|---|---|---|
| 58-63164 | 4/1983 | Japan | 257/53 |
| 61-159771 | 7/1986 | Japan | 257/449 |
| 62-58674 | 3/1987 | Japan | 257/449 |
| 2-26084 | 1/1990 | Japan | 257/53 |

*Primary Examiner*—William Mintel
*Assistant Examiner*—Minhloan Tran
*Attorney, Agent, or Firm*—Poms, Smith, Lande & Rose

[57] ABSTRACT

A photodiode capable of obtaining a sufficient photo current/dark ratio at both a forward bias state and a reverse bias state. The photodiode includes a glass substrate, an aluminum film formed as a lower electrode over the glass substrate, an alumina film formed as a Schottky barrier over the aluminum film, a hydrogenated amorphous silicon film formed as a photo conduction layer over a portion of the alumina film, and a transparent conduction film formed as an upper electrode over the hydrogenated amorphous silicon film.

10 Claims, 7 Drawing Sheets

PHOTODIODE HAVING A SCHOTTKY BARRIER FORMED ON THE LOWER METALLIC ELECTRODE

BACKGROUND OF THE INVENTION

The present invention relates to photodiodes, and more particularly to a photodiode exhibiting an increased ON/OFF current ratio and a method for fabricating the same.

Photodiodes are used for contact image sensors, bar code readers, facsimiles and etc.

FIG. 1 is a sectional view of a conventional photodiode using chromium silicide as its upper electrode.

For fabricating the photodiode shown in FIG. 1, a chromium film 12 is deposited in a vacuum over a glass substrate 11. The chromium film 12 is patterned by use of the wet etching process to form a lower electrode.

Thereafter, a hydrogenated amorphous silicon (a-Si:H) film 13 is deposited to a thickness of 1 μm over the entire exposed surface of the resulting structure. Over the a-Si:H film 13, another chromium film (not shown) is deposited. Subsequently, the chromium film is partially etched. Using the etched chromium film as a mask, the a-Si:H film 13 is patterned by use of the reactive ion etching (RIE) process.

The resulting structure is then subjected to an annealing treatment at a temperature of 250° C. in a $N_2$ atmosphere for one hour. By this annealing treatment, chromium silicide 14 is formed on an interface between the chromium film and the a-si:H film 13, thereby providing an upper electrode.

Using an $(NH_4)_2Ce(NO_3)_6$ acid, the remaining chromium film not forming silicide is removed. Thus, a photodiode is fabricated.

When a "+" bias is applied to the chromium film 12 while a "−" bias is applied to the chromium silicide 14 in the photodiode having the above-mentioned structure, a potential difference is generated due to the applied "+" bias and "−" bias. As a result, a current flows from the chromium film 12 as the lower electrode to the chromium silicide 14 as the upper electrode.

A Schottky effect is generated at the interface between a-Si:H film 13 and the chromium silicide 14. Due to such a Schottky effect, a Schottky barrier is formed which limits the dark current to several tens picoamperes.

Upon receiving light, the a-Si:H film 13 generates such as large amount of photo charges that the Schottky barrier no longer serves as the barrier for photo charges. As a result, a large amount of current flows through the interface between Che a-Si:H film 13 and the chromium silicide 14.

However, the fabrication of the above-mentioned conventional photodiode is complex because the chromium film deposited on the a-Si:H film 13 for the formation of the chromium silicide 14 should be removed after the formation of the chromium silicide 14.

FIG. 2 is a sectional view of another conventional photodiode using a transparent conduction film as its upper electrode.

For fabricating the photodiode shown in FIG. 2, a chromium film 22 is deposited over a glass substrate 21 to form a lower electrode. Thereafter, a hydrogenated amorphous silicon (a-Si:H) film 23 is deposited over the entire exposed surface of the resulting structure by using a plasma enhanced chemical vapor deposition (PECVD)process. Over the a-Si:H film 23, a transparent conduction film 24 made of indium thin oxide is deposited using a the sputtering process. Subsequently, the transparent conduction film 24 and the a-Si:H film 23 are etched using an RIE process to form an upper electrode and a photo conduction layer, respectively.

FIGS. 3A to 3C are diagrams respectively illustrating energy bands depending on voltages applied to the electrodes of the photodiode shown in FIG. 2.

When no voltage is applied to the photodiode, no current flows through the photodiode, as shown in FIG. 3A.

When a forward voltage is applied to the photodiode, that is, when "−" voltage is applied to the chromium film 22 as the lower electrode while "+" voltage is applied to the transparent conduction film 24, a large amount of dark current flows from the transparent conduction film 24 to the lower electrode 22 because a Schottky barrier is formed at an interface between the photo conduction layer 23 and the transparent conduction film 24, as shown in FIG. 3B.

As a result, a large amount of photo current can flow because of no effect of the Schottky barrier. At the forward bias state, it is, therefore, impossible to obtain a high photo current/dark current ratio.

On the other hand, when a reverse voltage is applied to the photodiode, that is, when "+" voltage is applied to the chromium film 22 as the lower electrode while "−" voltage is applied to the transparent conduction film 24, no current flows because a high potential barrier is formed between the photo conduction layer 23 and the transparent conduction film 24, as shown in FIG. 3C. As a result, little dark current flows.

As the photodiode is exposed to light under the condition that the reverse voltage is applied to the photodiode, a large amount of photo charges, namely, electrons and holes are generated in the photo conduction layer 23.

The generated electrons flow toward the lower electrode 22 while the generated holes flow the transparent conduction film 24. As a result, photo current can flow from the lower electrode 22 to the transparent conduction film 24.

Where the reverse voltage is applied to the photodiode, as mentioned above, the current flow through the photodiode is determined by the intensity of light applied to the photodiode.

The conventional photodiode shown in FIG. 2 can obtain a high ON/OFF current ratio in that the transparent conduction film 24 and the a-Si:H film 23 form the Schottky barrier inhibiting a flow of dark current at the reverse bias state. However, it is difficult to form a satisfactory Schottky barrier because the composition of the transparent conduction film 24 may be easily varied depending on the process used in depositing of the transparent conduction film 24 as the upper electrode and because the interface between the transparent conduction film 24 and the a-Si:H film 23 may be unstable.

As a result, the conventional photodiode has a problem that unstable dark current is generated between the photo conduction layer 23 and the transparent conduction film 24.

FIG. 4 is a sectional view of a photodiode having a conventional PIN structure. On the other hand, FIG. 5 is a diagram illustrating an energy band in the photodiode of FIG. 4.

As shown in FIG. 4, the photodiode comprises a lower electrode 31, a photo conduction layer 32 formed over the lower electrode 31, a transparent conduction film 33 formed over the photo conduction layer 32, and a metal electrode 34 formed over the transparent conduction film 33. In this structure, "+" voltage is applied to the lower electrode 31 while "−" voltage is applied to the transparent conduction film 33 as an upper electrode via the metal electrode 34.

The photo conduction layer 32 has a PIN structure including a high concentration n+a-Si:H film 32-1, an intrinsic a-Si:H film 32-2 and a high concentration p+a-Si:H film 32-3.

As the upper electrode 33, a chromium silicide film may be used in place of the transparent conduction film.

It is preferred that the upper electrode 33 adapted to pass light therethrough has a high transparency and a high conductivity. To this end, the transparent conduction film 33 comprised of an ITO film is bonded with the metal electrode 34 exhibiting a high conductivity to constitute a signal line because the ITO film exhibits a low conductivity.

This conventional photodiode having the above-mentioned structure achieves a signal sensing function obtained from the current difference between a case in which the photodiode is exposed to light and a case in which the photodiode is exposed to no light, under a reverse bias state, that is, when "+" voltage is applied to the lower electrode 31 while "−" voltage is applied to the upper electrode 33.

The current generated when the photodiode is exposed to light is called an ON current $I_{photo}$ whereas the current generated when the photodiode is exposed to no light is called an OFF current or dark current $I_{dark}$.

When the photodiode is exposed to light having an energy higher than an energy band gab Eg which is the difference between a conduction band Ec and a valence electron band Ev, as shown in FIG. 5, photo carriers are generated. As the photo carriers move, a flow of current is generated. This current is the photo current $I_{photo}$.

Where the energy band gap Eg is small, photo carriers are generated even if the photodiode is exposed to light having an energy lower than the energy band gab Eg. To this end, it is required to shield 100% of the light so as to accurately distinguish the photo current from the dark current.

However, it is difficult to perfectly shield the light. As a result, dark current is generated.

In photodiodes utilized in facsimiles for sensing light reflected from a document or other objects and thus recognizing characters and letters, the accurate control for dark current is very important for gray scale level designation. Where the level of dark current is imperfectly determined, the sensing operation is inaccurately achieved.

Where a plurality of photodiodes are used for a large document including a white part at one portion thereof and a black part at the other portion thereof, the characteristics of the photodiodes should be uniform.

For obtaining the accuracy in the sensing operation and the uniformity in device characteristic, a material exhibiting an appropriate energy band gap should be used. Furthermore, such a material exhibiting the appropriate energy band gap must be able to maintain the uniformity in device characteristic and control the dark current.

On the other hand, where the energy band gap is too large, it is impossible to accomplish the sensing function because all signals generated are detected as dark current.

Therefore, a good characteristic can be obtained in photodiodes wherein a large amount of photo current can flow while controlling a flow of dark current, thereby obtaining a high $I_{photo}/I_{dark}$ ratio.

The intrinsic a-Si:H film 32-2 exhibits an energy band gap Eg of about 1.7 eV. Where a trap is present, photo carriers are generated even by a light energy lower than the energy band gap Eg, as mentioned above. Of course, such a problem does not occur when the intrinsic a-Si:H film has a good quality. When photo carriers are generated by the light energy lower than the energy band gap Eg, an amount of dark current is increased, thereby resulting in a decrease in $I_{photo}/I_{dark}$ ratio. As a result, the photodiode exhibits a decreased signal/noise (S/N) ratio.

SUMMARY OF THE INVENTION

Therefore, an object of the invention is to solve the above-mentioned problems encountered in the prior art and to provide a photodiode capable of providing a high Schottky barrier and achieving an easy light absorption, thereby increasing a photo current/dark current ratio, and a method for fabricating the photodiode.

In accordance with one aspect, the present invention provides a photodiode comprising: a glass substrate; an aluminum film formed as a lower electrode over said glass substrate; an alumina film formed as a Schottky barrier over said aluminum film; a hydrogenated amorphous silicon film formed as a photo conduction layer over a portion of said alumina film; and a transparent conduction film formed as an upper electrode over said hydrogenated amorphous silicon film.

In accordance with another aspect, the present invention provides a method for fabricating a photodiode, comprising the steps of: depositing an aluminum film over a glass substrate to form a lower electrode; forming an alumina film over said aluminum film; depositing a hydrogenated amorphous silicon film over said alumina film; depositing a transparent conduction film over said hydrogenated amorphous silicon film; etching said transparent conduction film by use of a reactive ion etching process to form an upper electrode on a portion of the alumina film; and etching the hydrogenated amorphous silicon film under a condition that said upper electrode transparent is used as a mask, thereby forming a photo conduction layer,

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
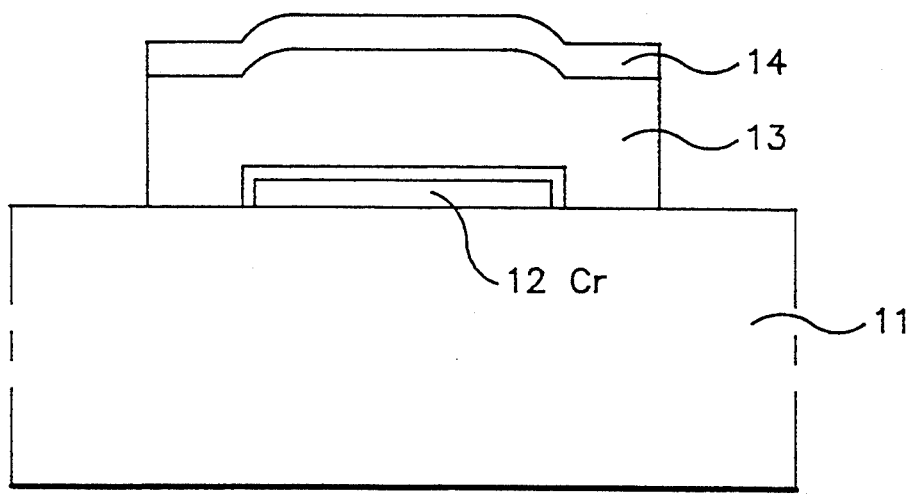
FIG. 1 is a sectional view of a conventional photodiode using a chromium silicide layer as its upper electrode.
Figure 2:
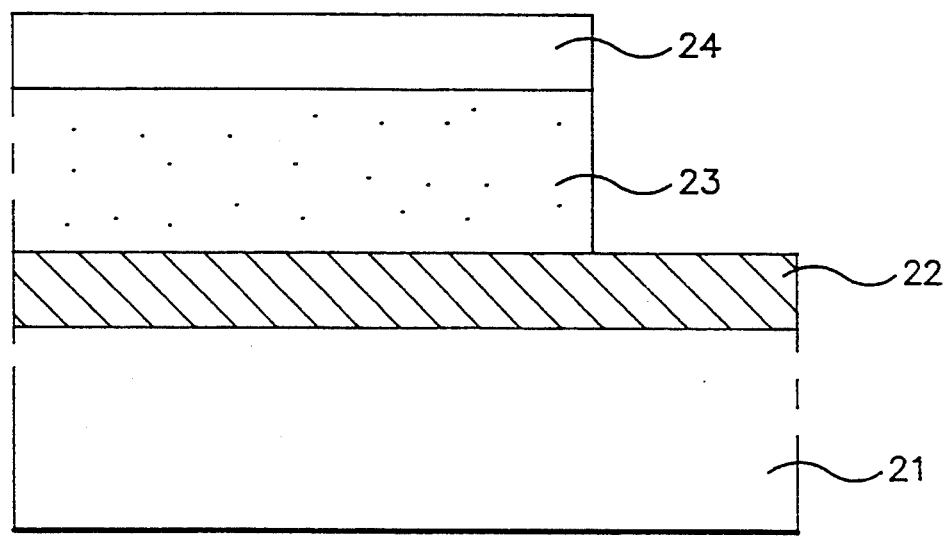
FIG. 2 is a sectional view of another conventional photodiode using a transparent conduction film as its upper electrode.
Figure 3A:
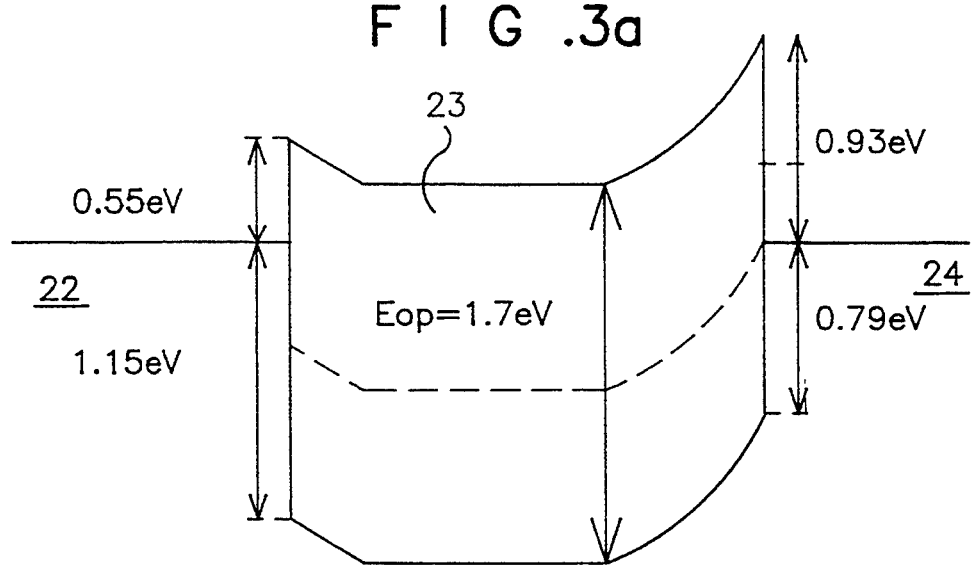
FIGS. 3A to 3C are diagrams respectively illustrating energy bands depending on voltages applied to the electrodes of the photodiode shown in FIG. 2.
Figure 3B:
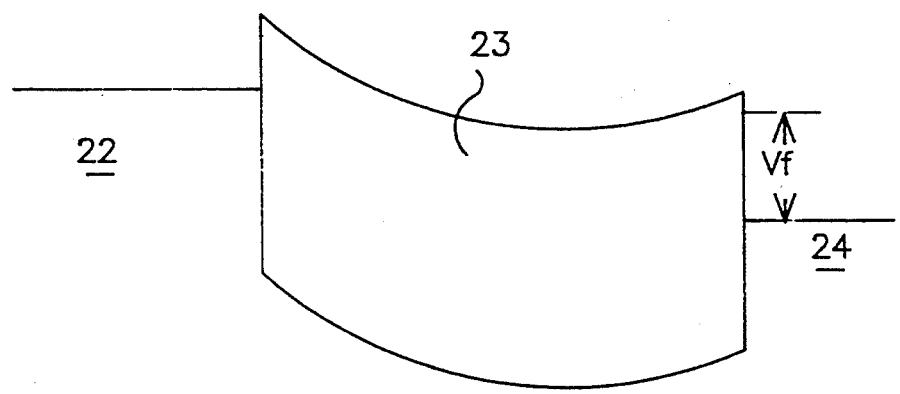
Figure 3C:
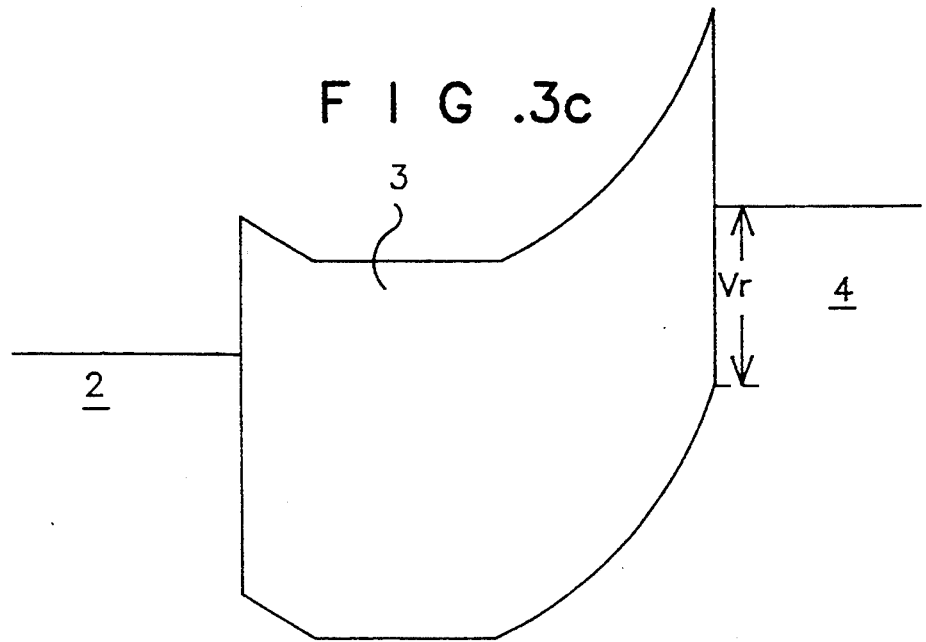
Figure 4:
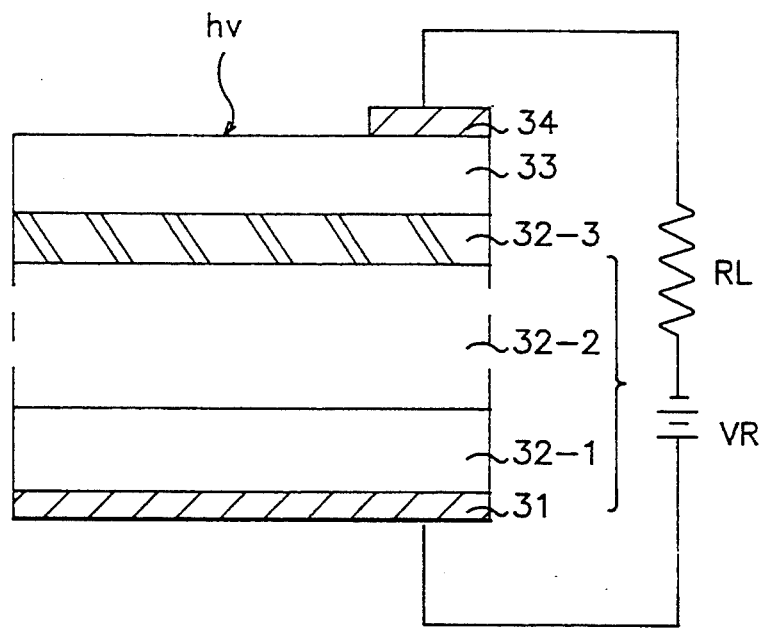
FIG. 4 is a sectional view of a photodiode having a conventional PIN structure.
Figure 5:
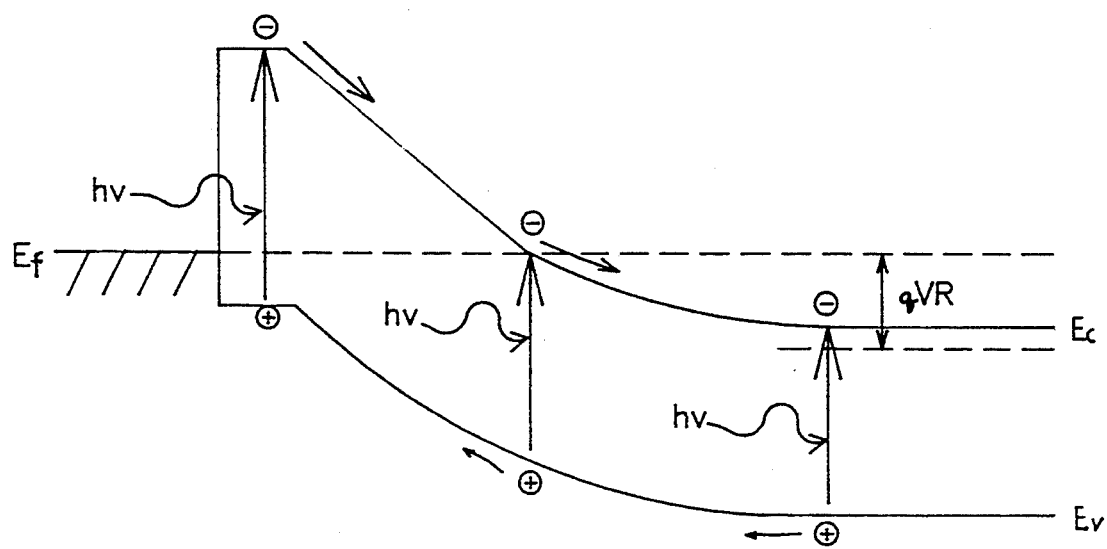
FIG. 5 is a diagram illustrating an energy band in the photodiode of FIG. 4.
Figure 6:
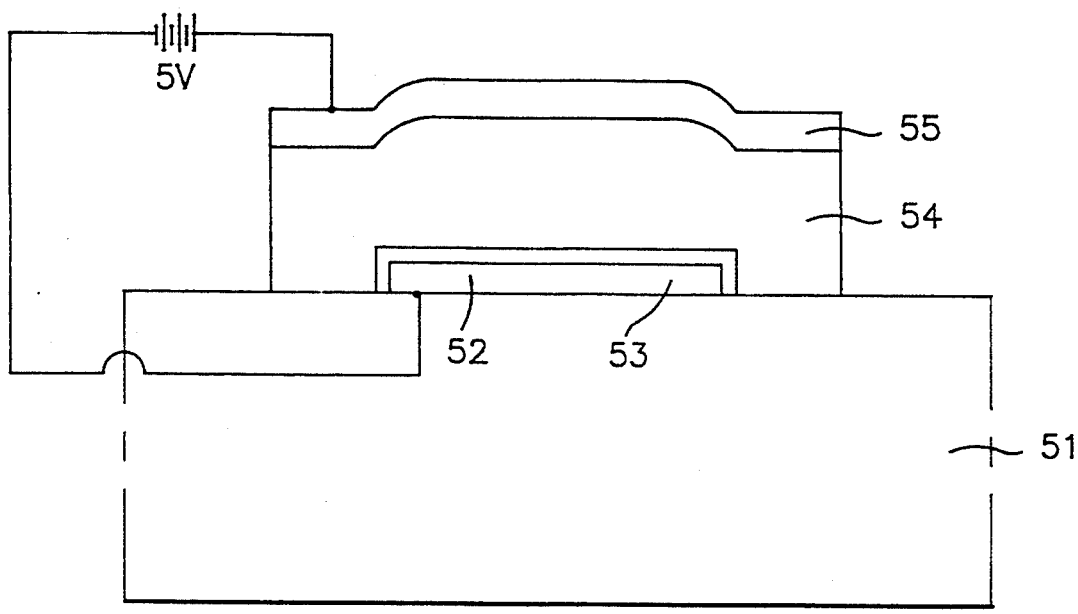
FIG. 6 is a sectional view of a photodiode in accordance with a first embodiment of the present invention.

FIG. 6 is a sectional view of a photodiode in accordance with a first embodiment of the present invention.

As shown in FIG. 6, the photodiode comprises a glass substrate 51, a chromium film 52 formed as a lower electrode on the glass substrate 51, a hydrogenated amorphous silicon (a-Si:H) film 54 formed as a photo conduction layer over the chromium film 52, a chromium silicide layer 53 formed at an interface between the chromium film 52 and the a-Si:H film 54, and a transparent conduction film 55 formed over the a-Si:H film 54.

In accordance with the first embodiment of the present invention, the chromium Film 52 is deposited in a vacuum over the glass substrate 51. The chromium film 52 is etched to form the lower electrode.

The a-Si:H film 54 is deposited to a thickness of 1 μm over the entire exposed surface of the resulting structure after the formation of the lower electrode, by use of the PECVD process. The resulting structure is then subjected to an annealing treatment at a temperature of 250° C. in a $N_2$ atmosphere for thirty minutes to one hour. By this annealing treatment, the chromium silicide 53 is formed on the interface between the chromium film 52 and the a-Si:H film 54.

Over the entire exposed surface of the resulting structure, the transparent conduction film 55 is deposited in vacuum to a thickness of 1,000 Å by using a sputtering process. The transparent conduction film 55 is then etched by using a RIE precess, thereby forming an upper electrode. Using the transparent conduction film 55 as a mask, the a-Si:H film 54 is subjected to an etching using the RIE process so that it can be patterned to fully cover the chromium film 52. Thus the photodiode having the above-mentioned structure obtained.

When a reverse voltage is applied to the photodiode, that is, when "—" bias is applied to the chromium film 52 as the lower electrode while "+" voltage is applied to the transparent conduction film 55 as the upper electrode, dark current flows from the transparent conduction film 55 to the chromium film 52. However, the amount of the dark current is very small, for example, $10^{-12}$ A, because a Schottky barrier is formed by the chromium silicide layer 53 formed at the interface between the chromium film 52 and the a-Si:H film 54.

When the photodiode is exposed to light at a reverse bias state, a large amount of photo charges are generated in the a-Si:H film 54. As the photo charges move, a considerably large amount of current can flow.

In other words, the amount of current flowing through the photodiode is determined by the intensity of light applied to the photodiode.

In accordance with the first embodiment of the present invention, a stable Schottky barrier is formed by virtue of the chromium silicide layer 53 formed between the chromium film 52 as the lower electrode and the a-Si:H film 54. As a result, the photo current/dark current ratio of the photodiode can be increased.

As mentioned above, the conventional structure requires chromium film as a lower electrode, for forming a chromium silicide layer corresponding to the chromium silicide layer 53 and removing the chromium film after the formation of the chromium silicide layer. In accordance with the first embodiment of the present invention, however, the chromium silicide layer is formed at the interface between the chromium film used as the lower electrode and the a-Si:H film. Accordingly, the structure of the present invention eliminates the additional steps required in the conventional structure.

Figure 7:
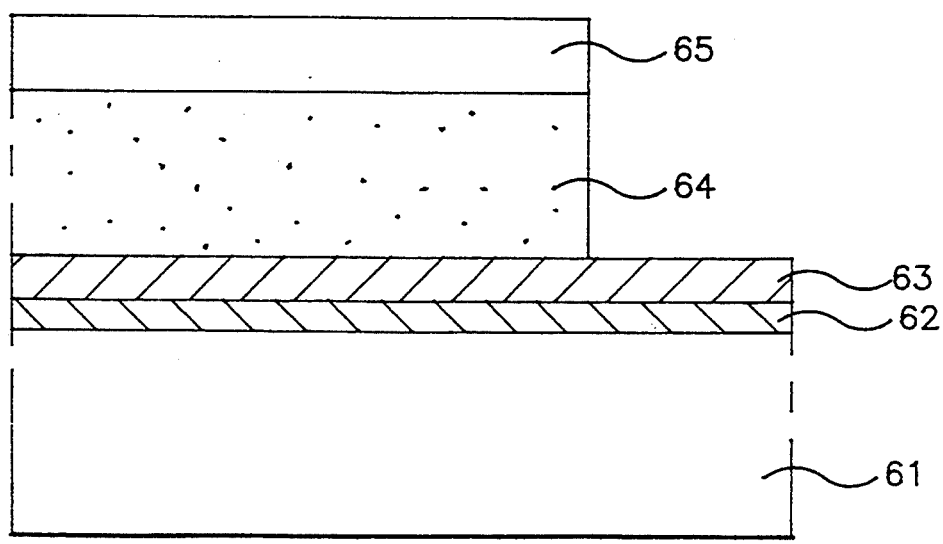
FIG. 7 is a sectional view of a photodiode in accordance with a second embodiment of the present invention.

FIG. 7 is a sectional view of a photodiode in accordance with a second embodiment of the present invention.

For fabricating the photodiode shown in FIG. 7, an aluminum film is deposited to a thickness of several ten hundreds angstroms over a glass substrate 61 by use of a vacuum deposition equipment so as to form a lower electrode 62.

The Al lower electrode 62 is then subjected to an anodization for forming an alumina ($Al_2O_3$) film 63. In other words, the alumina film 63 is formed over the Al lower electrode 62 by electrolyzing under a condition of using an electrolyte containing 12 to 25 wt % of boric acid or dilute sulfuric acid ($H_2SO_4$), a temperature of about 20° C., a current density of 130 to 260 $A/m^2$ and a voltage of 12 to 22 V.

Thereafter, an a-Si:H film 64 is deposited to a thickness of 800 ↑ to 1 μm over the alumina film 63 by use of the PECVD process. A transparent conduction layer 65 is then deposited to a thickness of 1,000 Å over the a-Si:H film 64 by use of the sputtering process.

The transparent conduction film 65 and the a-S1:H film 64 are etched using an RIE process, thereby forming an upper electrode and a photo conduction layer, respectively.

Figure 8:
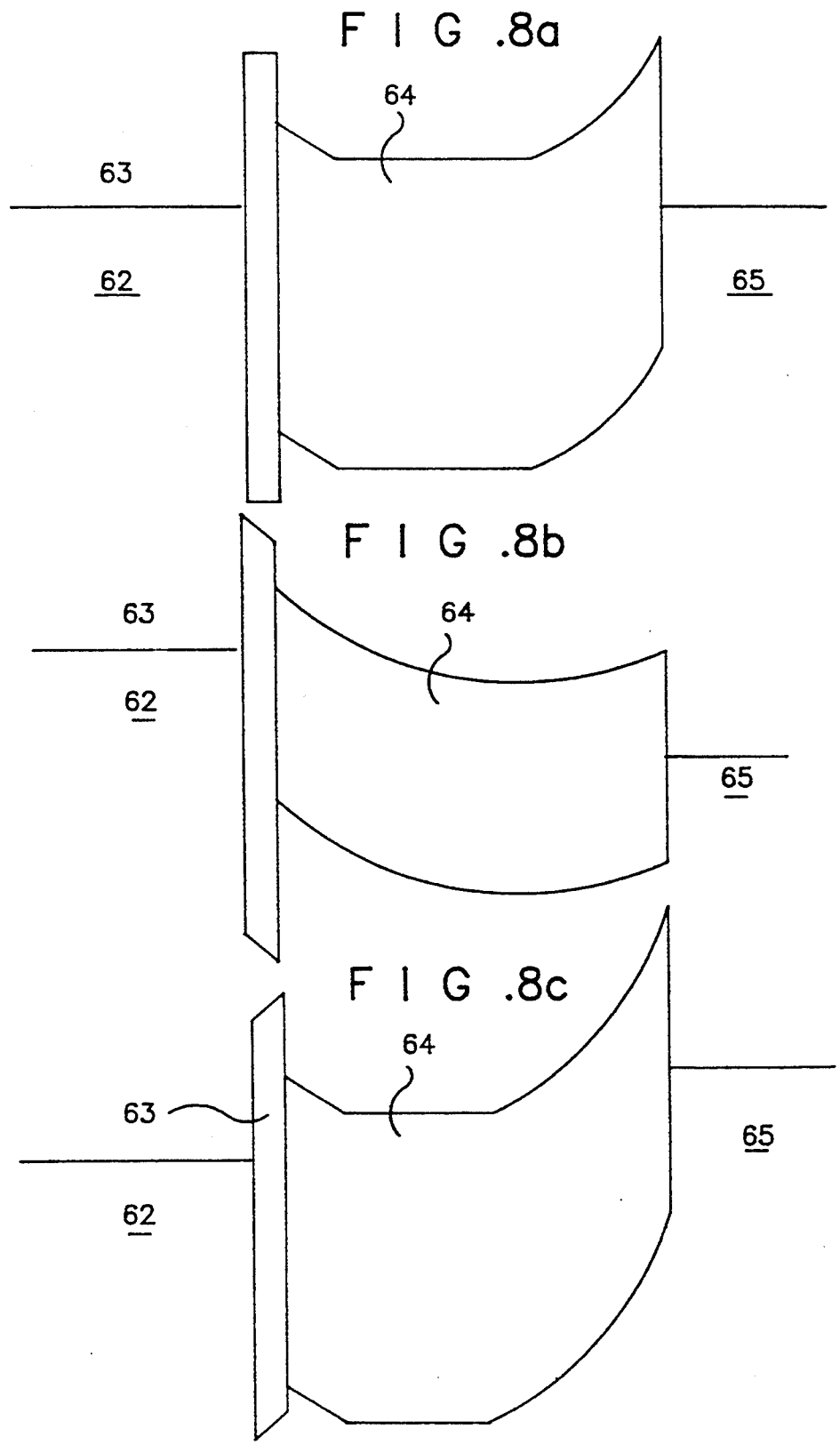
FIGS. 8A to *C are diagrams respectively illustrating energy bands depending on voltages applied to the electrodes of the photodiode shown in FIG. 7.

FIGS. 8A to 8C are diagrams respectively illustrating energy bands depending on voltages applied to the electrodes of the photodiode shown in FIG. 7.

When no voltage is applied to the photodiode, no current flows through the photodiode, as shown in FIG. 8A.

When a forward bias is applied to the photodiode, that is, when "—" voltage is applied to the Al lower electrode 62 while "+" voltage is applied to the transparent conduction film 65 as the upper electrode, a flow of dark current is inhibited in maximum because the alumina film 63 serves as a potential barrier, as shown in FIG. 8B. The amount of dark current may be $10^{-12}$ A or below.

The amount of photo current flowing through the photodiode is varied depending on the thickness of the alumina film 63. At a smaller thickness of the alumina film 63, the amount of photo current is increased. On the other hand, the amount of photo current is decreased at a larger thickness of the alumina film 63.

This is because electrons of photo charges are moved to the transparent conduction film 65 while holes of the photo charges are moved to the Al lower electrode 62 and affected by the barrier provided by the alumina film 63, so that a tunneling can occur only when the thickness of the alumina film 63 is not more than a predetermined thickness.

As a result, a potential barrier formed between the transparent conduction film 65 and the a-Si:H film 64 is lowered, so that the electrons can move sufficiently while a flow of holes is inhibited. Consequently, the holes accumulate. For compensating such a hole accumulation, electrons should be injected into the Al lower electrode 62.

Since the electrons should tunnel both the alumina film 63 and the a-Si:H film 64, the amount of injected electrons becomes larger at a smaller thickness of the alumina film 63. Accordingly, the amount of current becomes larger at the smaller thickness of the alumina film 63.

Thus the photo current is sensitive to the thickness of the alumina film 63 at the forward bias state.

On the other hand, when a reverse bias is applied to the photodiode, that is, when "+" voltage is applied to the Al lower electrode 62 while "−" voltage is applied to the transparent conduction film 65, no dark current flows because a Schottky barrier formed by the alumina film 63 and the transparent conduction film 65 serves to prevent a flow of charges.

As the photodiode is exposed to light under the condition that the reverse bias is applied to the photodiode, large amounts of photo charges are generated in the a-Si:H film 65. The generated photo charges tunnel the alumina film 63, thereby generating photo current.

Figure 9:
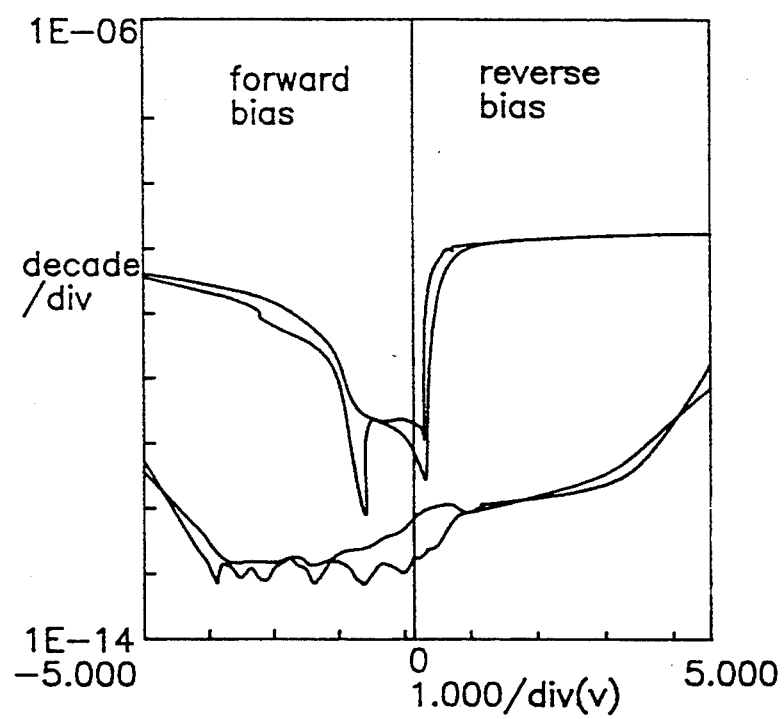
FIGS. 9 and 10 illustrate photo current and dark current generated at different bias states of the photodiode shown in FIG. 7, respectively.
Figure 10:
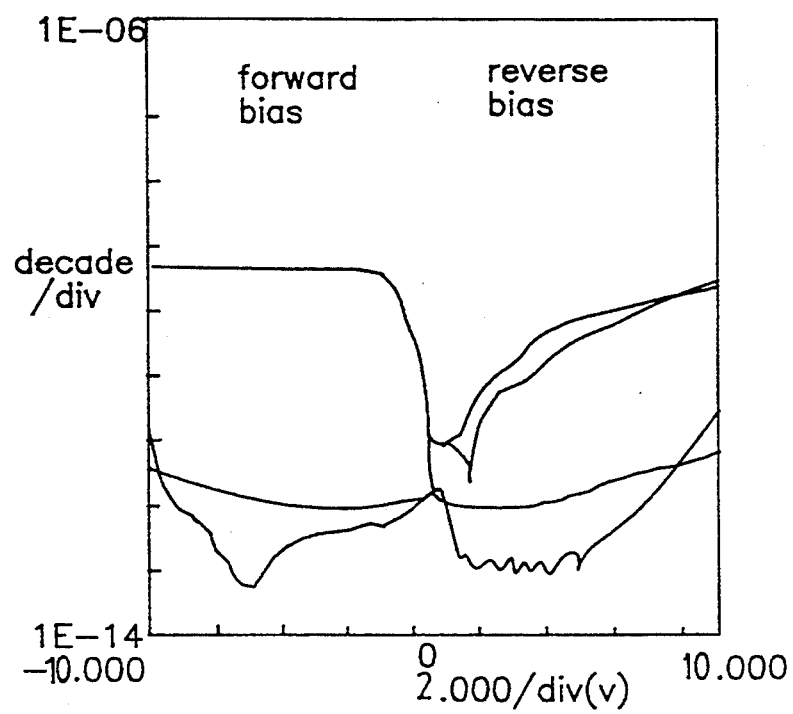

FIGS. 9 and 10 illustrate photo current and dark current generated at different bias states of the photodiode shown in FIG. 7, respectively.

At the reverse bias state that "−" voltage is applied to the transparent conduction film 65, the photo current has a substantially constant value of $5 \times 10^{-9}$ A irrespective of the thickness of the alumina film 63. On the other hand, the photo current/dark current ratio becomes higher at a smaller thickness of the alumina film 63.

Therefore, where the alumina film is used as the Schottky barrier layer, it is possible to break the conventional concept of forming the Schottky barrier layer near the transparent conduction film. On the other hand, the structure in which the Schottky barrier layer is formed near the lower electrode opposed to the ITO film solves the interface problem associated with the composition of the ITO film because provides an improved photo current/dark current ratio.

FIG. 9 corresponds to a case in which an electrolysis is carried out using an electrolyte of succinic acid, a voltage $V_{limit\ t}$ of 60 V and a current of 30 mA while the thickness of the alumina film 63 is 800 Å. On the other hand, FIG. 10 corresponds to a case in which an electrolysis is carried out using an electrolyte of succinic acid, a voltage $V_{limit}$ of 120 V and a current of 60 mA while the thickness of the alumina film 63 is 1,800 Å.

Figure 11:
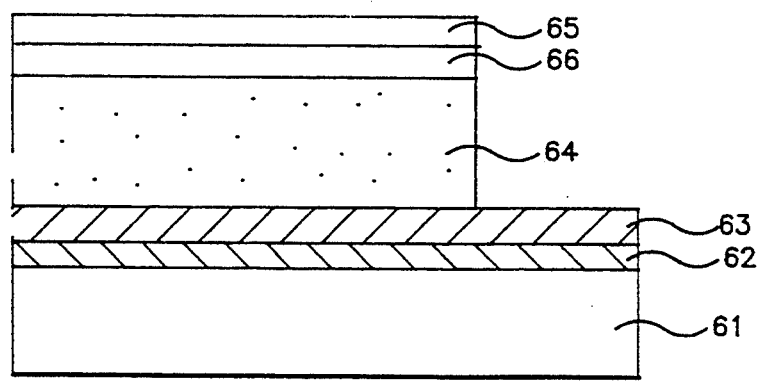
FIG. 11 is a sectional view of a photodiode in accordance with a third embodiment of the present invention.

FIG. 11 is a sectional view of a photodiode in accordance with a third embodiment of the present invention. The photodiode of the third embodiment has a similar structure to that of the second embodiment, except for an insulating film 66 formed as a dark current inhibiting layer between the a-Si:H film 64 and the transparent conduction film 65.

In accordance with this embodiment, the insulating film 66 is comprised of an SiN film or an $SiO_2$ film and has a thickness of several hundreds angstroms.

Using the insulating film 66 formed between the a-Si:H film 64 and the transparent conduction film 65 in accordance with the third embodiment, it is possible to obtain not only the characteristics obtained in the second embodiment, but also improvements in insulation characteristic and breakdown characteristic.

In accordance with both the second embodiment and the third embodiment, the following effects are obtained.

First, an improvement in S/N ratio is achieved in that a sufficient photo current/dark current ratio is obtained at both the forward bias state and the reverse bias state.

Second, an alumina film having little pin holes can be formed as a Schottky barrier layer on the Al lower electrode. Accordingly, it is possible to achieve an improvement in yield, generate stable dark currents, and prevent a generation of leakage current. Moreover, an increase in breakdown voltage is obtained so that the photodiode can bear an instantaneous shock.

Thus the photodiode can have an improved characteristics.

Figure 12:
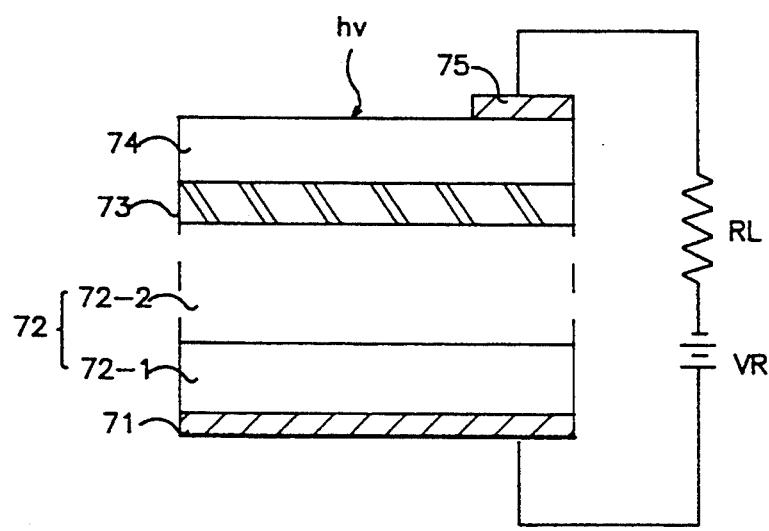
FIG. 12 is a sectional view of a photodiode in accordance with a fourth embodiment of the present invention.
Figure 13:
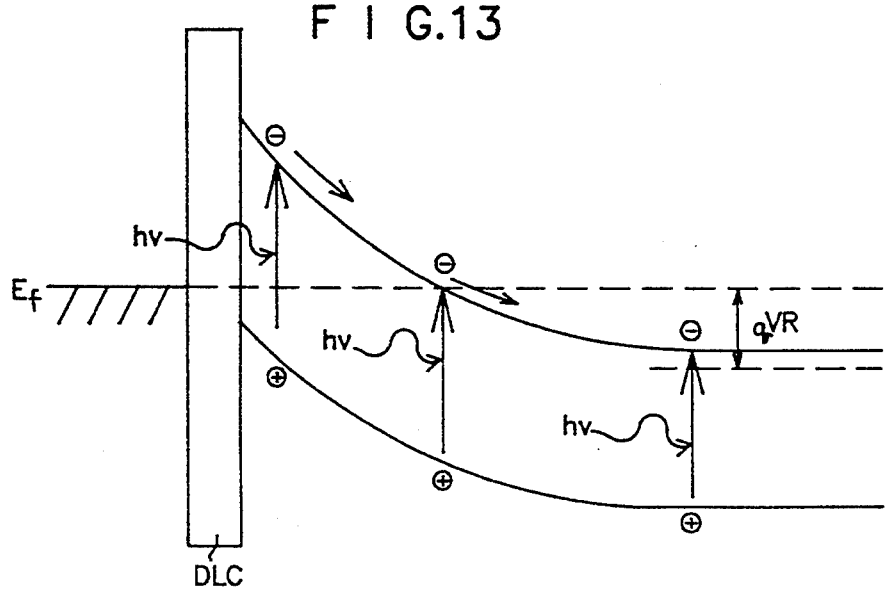
FIG. 13 is a diagram illustrating an energy band in the photodiode of FIG. 12.

FIG. 12 is a sectional view of a photodiode in accordance with a fourth embodiment of the present invention. FIG. 13 is a diagram illustrating an energy band in the photodiode of FIG. 12.

As shown in FIG. 12, the photodiode comprises a lower elect,rode 71, a photo conduction layer 72 formed over the lower elect, rode 71 and comprised of a n+a-Si:H film 72-1 and an intrinsic a-Si:H film 72-2, a thin diamond film 73 formed over the photo conduction layer 72 and adapted to control dark current, and a transparent, conduction film 74 formed as an upper electrode over the thin diamond film 73. In this structure, "+" voltage is applied to the lower electrode 71 while "−" voltage is applied to the upper electrode 74 via a metal electrode 75 formed on the upper electrode 74.

Since the thin diamond film 73 has an energy band gap of 3.75 to 4 eV substantially approximating the those of insulating films (generally, energy band gaps of insulating films are higher than 9 eV and energy band gaps of semiconductors are lower than 2 eV), it may be an insulating film when its thickness is too large. In this case, a photodiode cannot be fabricated. Preferably, the thin diamond film 73 has a thickness of about 200 to about 300 Å so as to control only the dark current.

The thin diamond film 73 may be formed using a $C_{12}H_{24}$ gas as a main gas and a $CF_4$ gas and an Ar gas as carrier gases in a container in which a magnetic field is exerted, in a sputtering manner or a CVD manner.

The thin diamond film 73 reacts with light of ultra violet wavelength not more than 0.35 μm while not reacting with light of wavelengths more than 0.35 μm and permitting it to pass therethrough. This is because the thin diamond film 73 is transparent and has an energy band gap of 3.75 to 4 eV. As a result, the thin diamond film 73 serves to inhibit a generation of photo carriers and thus control a generation of dark current at a lower level.

An energy applied to electrons can be expressed by the equation: $E = h\nu$ (h: Plank's constant and $\nu$: frequency of light). Since the frequency of light $\nu$ is inversely proportional to wavelength $\lambda$, the energy E is high at a short wavelength and low at a long wavelength.

Accordingly, the thin diamond thin film 73 permits light to pass therethrough at the visible light wavelength band exhibiting an energy band of more than 2.8 eV, because it has the energy band gap of 3.35 to 4 eV. As a result, no photo carrier is generated.

The light emerging from the diamond thin film 73 reacts only with the intrinsic photo conduction layer 72-2 disposed beneath the thin diamond thin film 73, thereby generating photo carriers. Accordingly, dark current cart be effectively controlled in the visible light wavelength band. At the ultra violet wavelength band, photo carriers are generated in the thin diamond film 73. In this case, photo carriers are also generated in the intrinsic conduction layer 72-2. Accordingly, it is possible to sense photo carriers of a broader band.

On the other hand, it is possible to provide more fractionated gray levels in the visible light band. Where gray levels between a white level and a black level are defined to distinctly recognize characters dimly written in a document even in a constant photo state, various gray levels can be provided by levels of photo current because the white absorbs a small amount of light and reflects a large amount of light.

Since the thin diamond film has a high energy band gap, the photo current can be subdivided into a plurality of levels. Such a subdivision of the photo current is advantageous for a high gray scale level.

As apparent from the above description, the present invention provides a photodiode capable of increasing a resolution and improving characteristics.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A photodiode comprising:
   a glass substrate:
   a chromium film formed as a lower electrode on a central portion of said glass substrate;
   a hydrogenated amorphous silicon film formed as a photo conduction layer over the glass substrate so as to sufficiently cover said chromium film;
   a chromium silicide film for a Schottky barrier formed by an annealing process and at an interface between the chromium film and the hydrogenated amorphous silicon film; and
   a transparent conduction film formed over the hydrogenated amorphous silicon film.

2. A photodiode comprising:
   a glass substrate;
   an aluminum film formed as a lower electrode over said glass substrate;
   an alumina film formed as a Schottky barrier over said aluminum film;
   a hydrogenated amorphous silicon film formed as a photo conduction layer over a portion of said alumina film;
   a transparent conduction film formed as an upper electrode over said hydrogenated amorphous silicon film; and
   a dark current inhibiting layer formed between said hydrogenated amorphous silicon film and said transparent conduction film;
   wherein when a negative voltage is applied to said lower electrode a forward bias is applied to said photodiode.

3. A photodiode in accordance with claim 2, wherein said dark current inhibiting layer is comprised of an insulating film.

4. A photodiode in accordance with claim 3, wherein said insulating film is comprised of one of an SiN film and an $SiO_2$ film.

5. A photodiode comprising:
   a glass substrate;
   a lower electrode formed over said glass substrate;
   a high concentration n type hydrogenated amorphous silicon film formed over said lower electrode;
   a photo conduction layer constituted by an intrinsic hydrogenated amorphous silicon film formed over said high concentration n type hydrogenated amorphous silicon film;
   a thin diamond film for a dark current control formed over said photo conduction layer; and
   a transparent electrode formed as an upper electrode over said thin diamond film.

6. A photodiode in accordance with claim 5, wherein said thin diamond film has a thickness of 200 to 300 Å.

7. A photodiode comprising:
   a glass substrate;
   an aluminum film formed as a lower electrode over said glass substrate;
   an alumina film formed as a Schottky barrier over said aluminum film;
   a hydrogenated amorphous silicon film formed as a photo conduction layer over a portion of said alumina film;
   a transparent conduction film formed as an upper electrode over said hydrogenated amorphous silicon film; and
   a dark current inhibiting layer formed between said hydrogenated amorphous silicon film and said transparent conduction film.

8. A photodiode in accordance with claim 7, wherein said dark current inhibiting layer is comprised of an insulating film.

9. A photodiode in accordance with claim 8, wherein said insulating film is comprised of an SiN film.

10. A photodiode in accordance with claim 8, wherein said insulating film is comprised of an $SiO_2$ film.

* * * * *